United States Patent
Yang et al.

(10) Patent No.: US 7,342,178 B2
(45) Date of Patent: Mar. 11, 2008

(54) FLEXIBLE PRINTED CIRCUIT FILM

(75) Inventors: Young Tae Yang, Kyoungsangbuk-do (KR); Kyong Rak Lee, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 622 days.

(21) Appl. No.: 09/893,963

(22) Filed: Jun. 29, 2001

(65) Prior Publication Data

US 2002/0050399 A1 May 2, 2002

(30) Foreign Application Priority Data

Jul. 6, 2000 (KR) .......................... 10-2000-38468

(51) Int. Cl.
*H05K 1/00* (2006.01)
(52) U.S. Cl. ...................... 174/254; 361/748
(58) Field of Classification Search ................ 174/254, 174/268; 361/746–751; 439/77
See application file for complete search history.

(56) References Cited

U.S. PATENT DOCUMENTS

| | | | |
|---|---|---|---|
| 3,267,402 A * | 8/1966 | Reimer ....................... 336/200 |
| 4,587,719 A * | 5/1986 | Barth .......................... 438/113 |
| 4,607,147 A * | 8/1986 | Ono et al. .................. 200/512 |
| 4,716,259 A | 12/1987 | Tokura et al. |
| 4,748,293 A * | 5/1988 | Kikuchi et al. ............. 174/268 |
| 4,955,239 A * | 9/1990 | Cage et al. ............ 73/861.355 |
| 5,404,239 A * | 4/1995 | Hirai .......................... 349/150 |
| 5,777,275 A * | 7/1998 | Mizutani et al. ............ 174/254 |
| 5,903,440 A * | 5/1999 | Blazier et al. .............. 361/749 |
| 5,917,158 A * | 6/1999 | Takao et al. ................ 174/254 |

FOREIGN PATENT DOCUMENTS

| DE | 691 05 042 T2 | 3/1993 |
| DE | 198 56 839 A1 | 6/2000 |
| GB | 2 116 370 A | 9/1983 |

(Continued)

OTHER PUBLICATIONS

Office Action issued by the Japanese Patent Office on Oct. 3, 2006.

(Continued)

*Primary Examiner*—Jeremy C Norris
(74) *Attorney, Agent, or Firm*—McKenna Long & Aldridge LLP

(57) ABSTRACT

A flexible printed circuit film that is capable of preventing a bonded pad from being separated or opened because of a force applied to a bonded part when the flexible printed circuit film is engaged to a printed circuit board. In the film, a first pad is provided at one end of a body to be adhesively connected to a second pad of a first printed circuit board. A third pad is provided at other end of the body to be engaged to a connecter of a second printed circuit board. At least one recess is defined in the body of the flexible printed circuit film. Accordingly, it becomes possible to prevent a contact portion between other pad of the FPC film and the pad of the data circuit board from being separated or opened due to a force applied upon engagement of one pad of the FPC film to the connecter of the timing control board.

34 Claims, 4 Drawing Sheets

FOREIGN PATENT DOCUMENTS

| | | |
|---|---|---|
| JP | 3-159190 | 7/1991 |
| JP | 3-10677 | 11/1991 |
| JP | 04-103092 | 3/1992 |
| JP | 04-144186 | 5/1992 |
| JP | 0 5 155 044 A | 6/1993 |
| JP | 05-155044 | 6/1993 |
| JP | 8-124635 | 5/1996 |
| JP | 9-83100 | 3/1997 |
| JP | 09-162505 | 6/1997 |
| JP | 09-205257 | 8/1997 |
| JP | 2000-077797 | 3/2000 |

OTHER PUBLICATIONS

Office Action issued by the Korean Patent Office on Nov. 21, 2006.

* cited by examiner

FLEXIBLE PRINTED CIRCUIT FILM

This application claims the benefit of Korean Patent Application No. P00-38468 filed on Jul. 6, 2000 which is hereby incorporated by reference as if fully set forth herein.

BACKGROUND OF THE INVENTION

1. Field of the Invention

This invention relates to a flexible printed circuit film, and more particularly to a flexible printed circuit film that is capable of preventing a bonded pad from being separated or opened due to a tension applied to a bonded part when the flexible printed circuit film is engaged to a printed circuit board.

2. Discussion of the Related Art

Generally, a liquid crystal display (LCD) module controls light transmissivity in accordance with an electric field to thereby display a picture corresponding to video signals. To this end, the liquid crystal display module includes a liquid crystal display panel having a plurality of pixels arranged in a matrix and a driving circuit for driving the liquid crystal display panel.

Each pixel arranged on the liquid crystal display panel includes a liquid crystal cell positioned at an intersection between a gate line and a data line, and a thin film transistor (TFT) for selectively connecting the liquid crystal cell to the data line in response to a signal on the gate line. The driving circuit for driving the liquid crystal display panel consists of a data driving integrated circuit (IC) for driving the data lines on the liquid crystal display panel, a gate driving IC for driving the gate lines on the liquid crystal display panel, and a control circuit for controlling the gate driving IC and the data driving IC. These driving IC's usually take the shape of a chip and are mounted in a tape carrier package (TCP) in the case of a tape automated bonding (TAB) system, or on the surface of the liquid crystal display panel in the case of a chips on glass (COG) system.

In the case of the TAB system, the driving IC's are electrically connected to a pad provided at the liquid crystal display panel by the TCP. For instance, in the LCD module of a TAB system, as shown in FIG. 1, the rear side of a liquid crystal display panel 1 is provided with a timing control board 6, a data circuit board 4, flexible printed circuit (FPC) film 12 and a gate circuit board 2. Data driving IC chips 10 are loaded in a TCP 8 to be connected, via the TCP 8, to the liquid crystal display panel 1 and the data circuit board 4. Gate driving IC chips (not shown) also are loaded in the TCP 8 to be connected, via the TCP 8, to the liquid crystal display panel 1 and the gate circuit board 2. The data circuit board 4 is connected, via the FPC film 12, to the timing control board 6 to relay a data transmission between the timing control board 6 and the data driving IC chips 10. The gate circuit board 2 also is connected, via a FPC film (not shown), to the timing control board 6 to relay a signal transmission between the timing control board 6 and the gate driving IC chips.

The FPC film 12 connected between the data circuit board 4 and the timing control board 6 usually has an "L" shape. The timing control board 6 applies a data control signal, which includes a data signal and a synchronizing signal, etc., via the FPC film 12, to the data circuit board 4. Further, the timing control board 6 applies a gate control signal, which includes a synchronizing signal, etc., via the FPC film (not shown), to the gate circuit board 2. The TCP 8 loaded with the data driving IC chips 10 is electrically connected to one pad area of the liquid crystal display panel 1 and, at the same time, one edge of the data circuit board 4. In a similar manner, the TCP loaded with the gate driving IC chips also is electrically connected between the liquid crystal display panel 1 and the gate circuit board 2.

The FPC film 12 includes a first pad 16 for connecting to a pad of the data circuit board 4, and a second pad 18 for connecting to the timing control board 6. The first pad 16 is adhered to the pad of the data circuit board 4 by an anisotropic conductive film. The second pad 18 of the FPC film contacts a connecter 14, which is provided at one end of the timing control board 6. To engage the second pad 18 of the FPC film 12 with the connecter 14, force is applied from the exterior to the connecter 14 in the "A" direction toward the second pad 18, as shown in FIG. 2. At this time, force is transferred via a body of the FPC film 12, into the first pad 16. Thus, a contact portion between the first pad 16 and the pad of the data circuit board 4 is separated or opened by the force transferred to the first pad 16. This causes a serious problem of an electrical breakage between the timing control board and the data circuit board.

SUMMARY OF THE INVENTION

Accordingly, it is an object of the present invention to provide a flexible printed circuit film that is capable of preventing a bonded pad from being separated or opened due to tension applied to a bonded part when the flexible printed circuit film is attached to a printed circuit board.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other objects of the invention, a flexible printed circuit film according to the present invention includes a body; a first pad provided at one end of the body to be adhesively connected to a pad of a first printed circuit board; a second pad provided at other end of the body to be engaged to a connecter of a second printed circuit board; and at least one recess defined at the body.

In the flexible printed circuit, the recess is defined at each side surface of the body adjacent to the second pad. The body has at least one bent portion, and said recess is defined at the bent portion. Alternatively, said at least one recess is defined at the bent portion and said at least one recess is at the body adjacent to the second pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
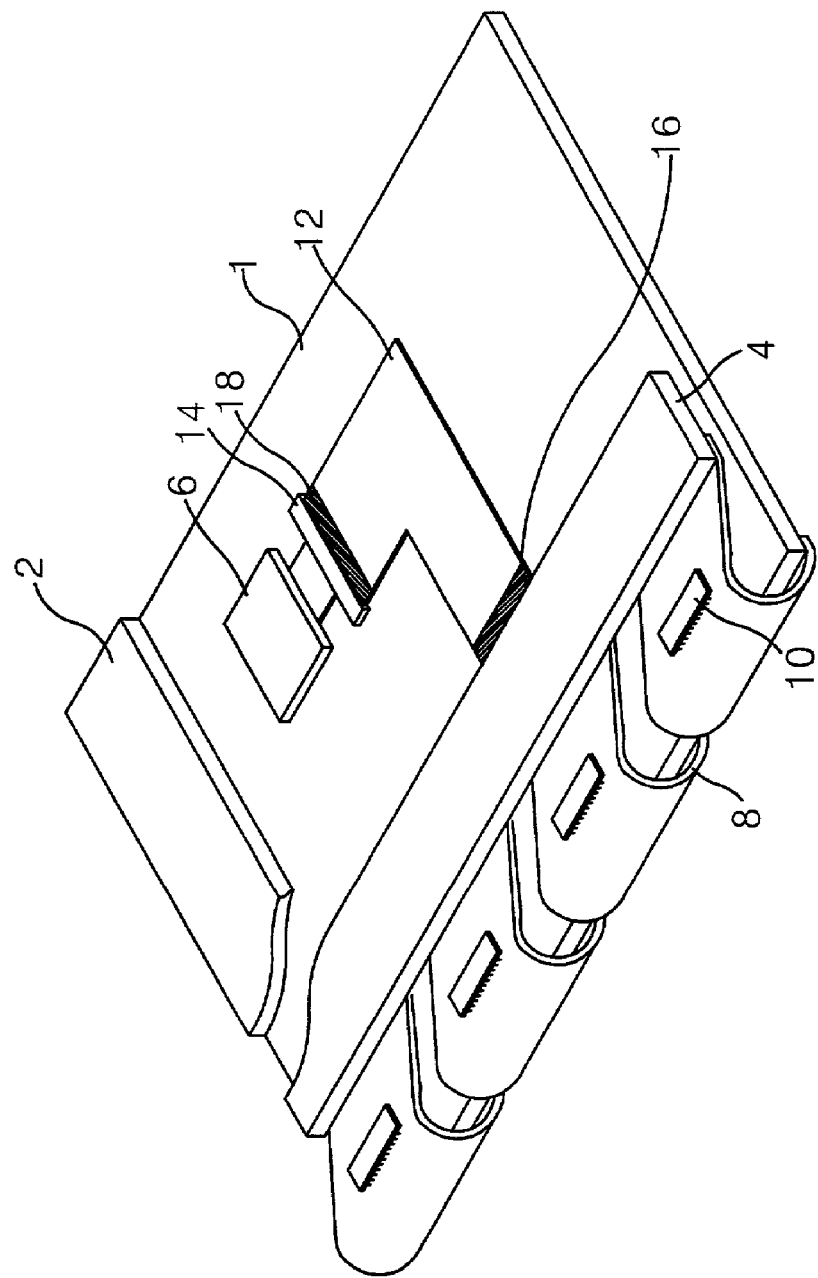
FIG. 1 is a schematic perspective view showing a structure of a conventional tape carrier package-type liquid crystal display module.
Figure 2:
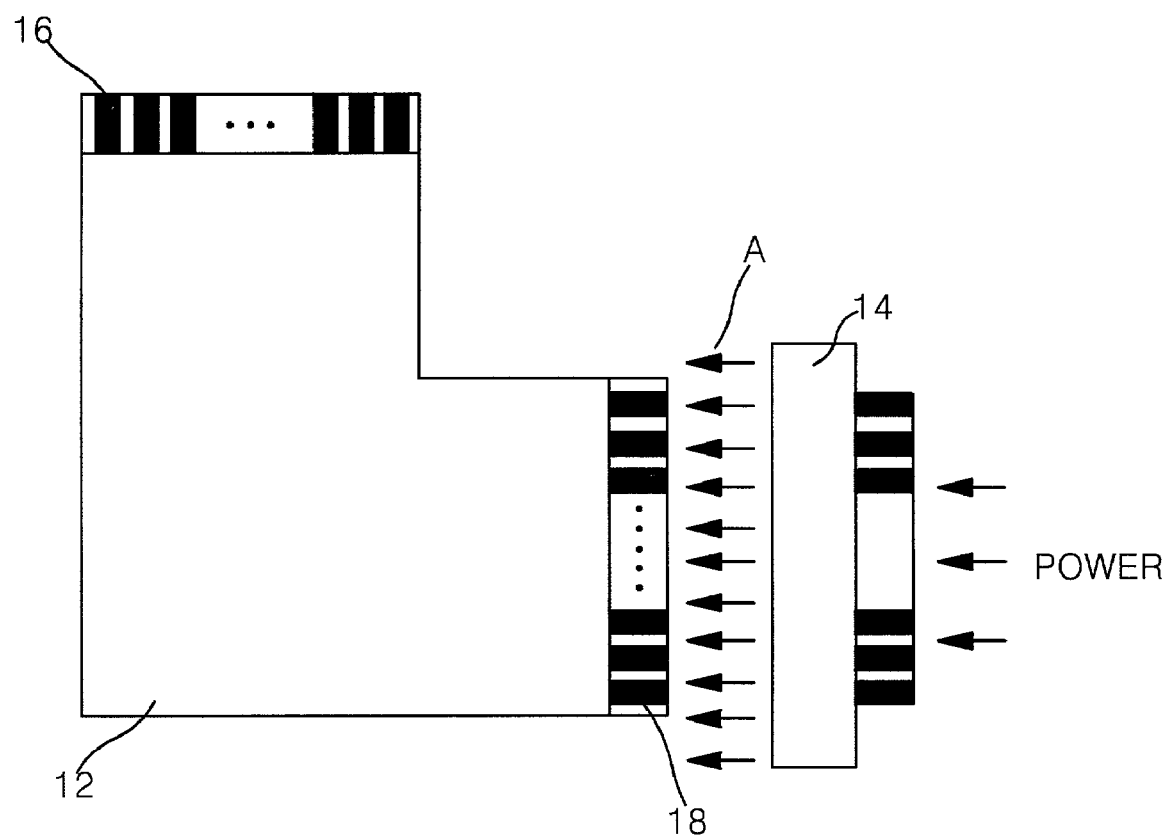
FIG. 2 is a plan view of the flexible printed circuit film shown in FIG. 1.
Figure 3:
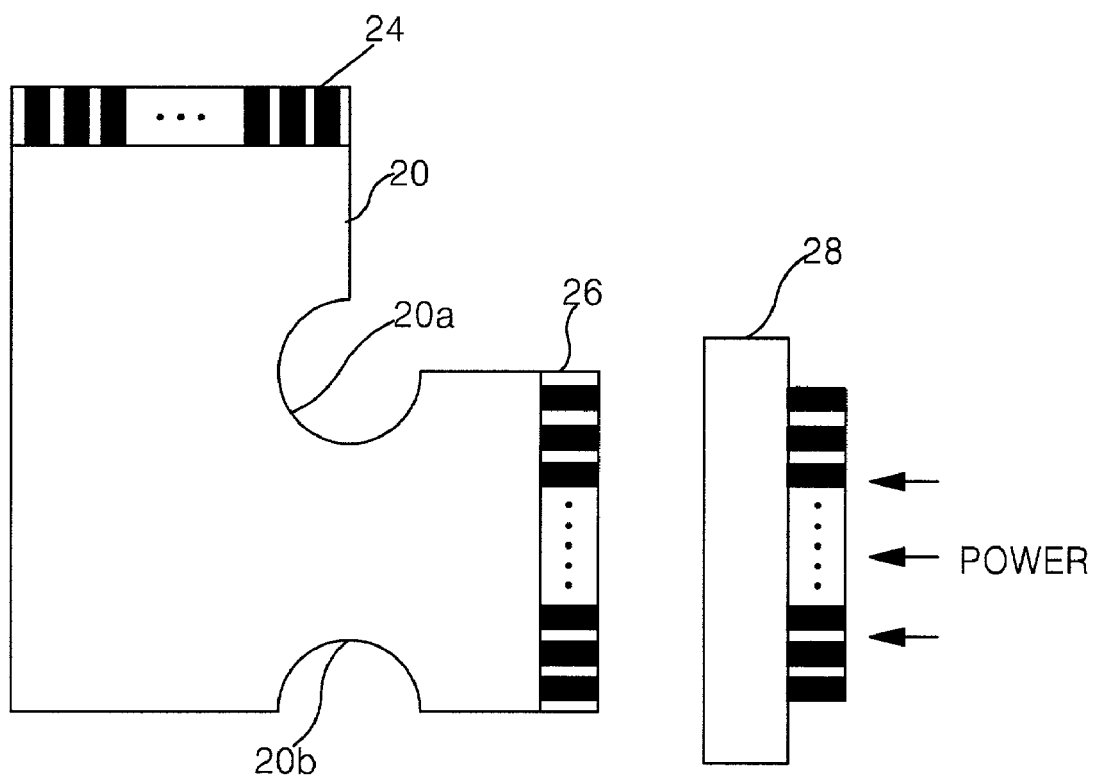
FIG. 3 is a plan view of a flexible printed circuit film according to a first embodiment of the present invention.

Referring to FIG. 3, there is shown a flexible printed circuit (FPC) film according to a first embodiment of the present invention. The FPC film 20 includes a first pad 24 connected to a pad of a data circuit board (not shown), a second pad 26 for connecting to a connecter 28 of a timing control board (not shown), and first and second recesses 20a and 20b defined at the bent or corner portion of the FPC film 20. The FPC film 20 is positioned between the timing control board 6 and the data circuit board 4, as shown in FIG. 1, to electrically connect them. The FPC film 20 has substantially an "L" shape, having a single bent or corner portion. The first pad 24 of the FPC film 20 is adhesively connected to the pad of the data circuit board by an anisotropic conductive film. The second pad 26 engages the connecter 28 of the timing control board 6. To prevent the force applied to engage the connecter 28 to the second pad 26 from being transferred to the first pad 24 via the FPC film 20, first and second recesses 20a and 20b are defined at the bent portion of the FPC film 20. The first and second recesses 20a and 20b are formed respectively at an inner side of the FPC film 20 at a vertex of FPC film 20, i.e., where the FPC film 20 is bent at substantially a right angle, and at an outer side of the FPC film. Such recesses 20a and 20b absorb a force transferred, via a body of the FPC 20, to the first pad 24 upon engagement of the connecter 28 to the second pad 26. Accordingly, it becomes possible to prevent a contact portion between the first pad 24 of the FPC film 20 and the data circuit board from being separated or opened as a result of the force applied to the connecter 28. Furthermore, the recesses 20a and 20b prevent movement of the FPC film 20 in the direction in which the connecter 28 is engaged or assembled, thereby allowing simplified assembly of the second pad 26 of the FPC film 20 and the connecter 28.

Figure 4:
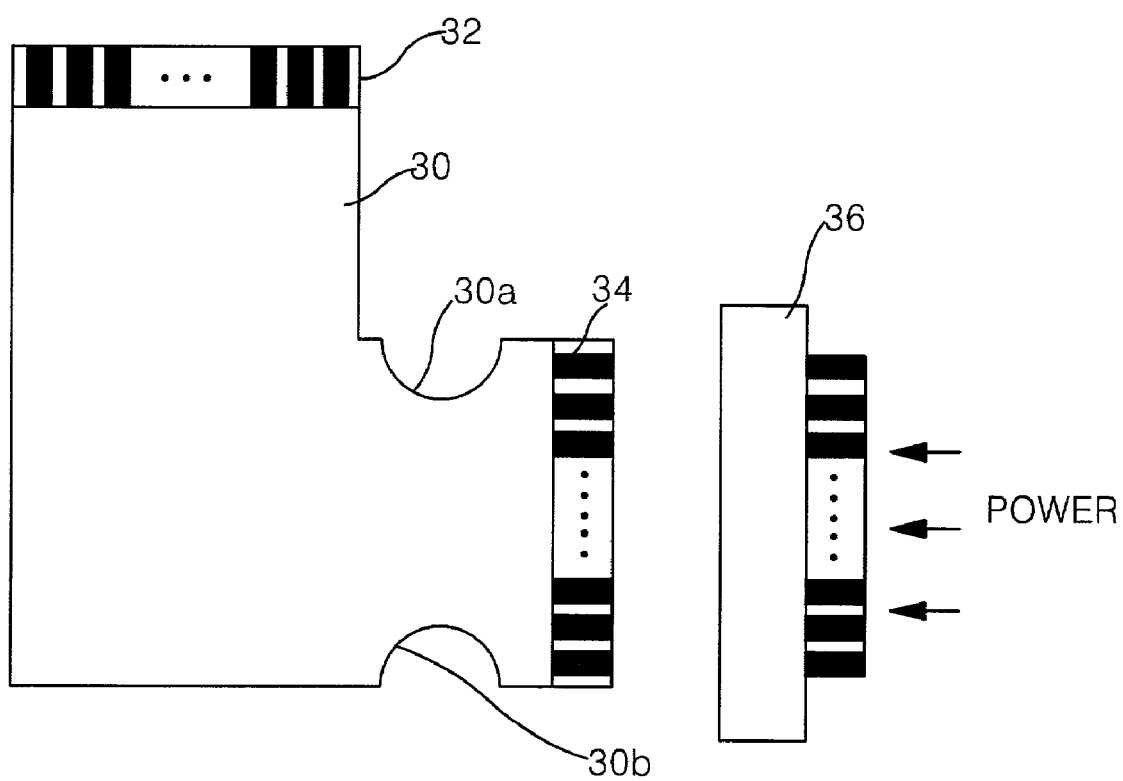
FIG. 4 is a plan view of a flexible printed circuit film according to a second embodiment of the present invention.

Referring to FIG. 4, there is shown a flexible printed circuit (FPC) film according to a second embodiment of the present invention. The FPC film 30 includes a first pad 32 connected to a pad of a data circuit board (not shown), a second pad 34 for connecting to a connecter 36 of a timing control board (not shown), and first and second recesses 30a and 30b defined at a portion adjacent to the second pad 34 of the FPC film 30. The first pad 32 is adhesively connected to the pad of the data circuit board by an anisotropic conductive film. The second pad 34 engages the connecter 36 of the timing control board.

The first and second recesses 30a and 30b are provided in such a manner to be adjacent to the second pad 34. In other words, the first and second recesses 30a and 30b are defined at each side surface between a bent or corner portion of the FPC film 30, which has substantially an "L" shape, and the second pad 36. Such recesses 30a and 30b absorb a force transferred, via a body of the FPC 30, to the first pad 32 to engage the connecter 36 to the second pad 34. Accordingly, it becomes possible to prevent a contact portion between the first pad 32 of the FPC film 30 and the data circuit board from being separated or opened because of the force applied to the connecter 36. Furthermore, the recesses 30a and 30b prevent movement of the FPC film 30 in the direction in which the connecter 36 is engaged or assembled, thereby allowing simplified assembly of the second pad 34 of the FPC film 30 and the connecter 36.

As described above, according to the present invention, each side surface of the FPC film is provided with the recesses, so that it becomes possible to prevent a contact portion between other pad of the FPC film and the pad of the data circuit board from being separated or opened because of a force applied upon engagement of one pad of the FPC film to the connecter of the timing control board. Furthermore, the recesses defined at each side surface of the FPC film prevent movement of the FPC film a connecter engagement direction, thereby allowing an easier engagement of the connecter and the FPC film.

It will be apparent to those skilled in the art that various modifications and variation can be made in the present invention without departing from the split or scope of the invention. Thus, it is intended that the present invention cover the modifications and variations of this invention provided they come within the scope of the appended claims and their equivalents.

What is claimed is:

1. A flexible printed circuit film for connecting external circuits, comprising:
   an L-shaped body;
   a first pad provided at one end of the body to be adhesively connected to a pad of a first printed circuit board;
   a second pad provided at an end of the body opposite the one end of the body to be engaged to a connecter of a second printed circuit board and electrically connected to the first pad; and
   at least one force absorbing edge recess defined in the body that absorbs a force transferred from the second pad, the force applied to engage the second pad to the connecter.

2. The flexible printed circuit film according to claim 1, wherein a recess of the at least one force absorbing edge recesses is defined in the body in a region adjacent to the second pad.

3. The flexible printed circuit film according to claim 2, wherein a recess of the at least one force absorbing edge recesses is defined in at least two side surfaces of the body in the region adjacent to the second pad.

4. The flexible printed circuit film according to claim 1, at least one of the at least one force absorbing edge recesses is located at an inner corner of the body.

5. The flexible printed circuit film according to claim 4, the body having at least two side surfaces wherein a recess of the at least one force absorbing edge recesses is defined at each of the at least two side surfaces in a region adjacent to the inner corner of the body.

6. The flexible printed circuit film according to claim 4, wherein a first force absorbing edge recess is defined at the inner corner and said at least one force absorbing edge recess is defined in the body in a region adjacent to the second pad.

7. The flexible printed circuit film according to claim 4, wherein the body having at least two side surfaces wherein the at least one recess is defined at a region adjacent to the bent portion.

8. The flexible printed circuit film of claim 1, wherein the at least one recess has a substantially concave shape.

9. The flexible printed circuit film according to claim 8, wherein the concave shape is greater than a semicircle.

10. The flexible printed circuit film according to claim 8, wherein the concave shape has a shape of an incomplete circle.

11. The flexible printed circuit film of claim 1, wherein the at least one recess has a substantially curved shape.

12. The flexible printed circuit film according to claim 1, wherein the at least one force absorbing edge recess includes a cutout portion.

13. A flexible printed circuit film for connecting external circuits, comprising:
   an L-shaped body having a first portion and a second portion, the first portion intersecting the second portion to form a corner portion, the corner portion having an inner vertex and an outer vertex;
   a first pad connected at an end of the first portion;
   a second pad at an end of the second portion away from inner vertex and the outer vertex and electrically connected to the first pad, wherein the second pad is to engage a connector to connect to circuit external to the body; and
   a first force absorbing recess in the body that absorbs a force transferred from the second pad, the first force applied to engage the second pad to the connector.

14. The flexible printed circuit film of claim 13, wherein the first recess has a substantially concave shape.

15. The flexible printed circuit film according to claim 14, wherein the concave shape is greater than a semicircle.

16. The flexible printed circuit film according to claim 14, wherein the concave shape has a shape of an incomplete circle.

17. The flexible printed circuit film of claim 13, wherein the first recess has a substantially curved shape.

18. The flexible printed circuit film of claim 13, wherein the first portion is substantially perpendicular to the second portion.

19. The flexible printed circuit film of claim 13, wherein the first recess is at the inner vertex of the corner portion.

20. The flexible printed circuit film of claim 19, further comprising a second recess in a region of the second portion of the body, the region being between the outer vertex of the corner portion and the second pad.

21. The flexible printed circuit film of claim 20, wherein the second recess has a substantially concave shape.

22. The flexible printed circuit film according to claim 21, wherein the concave shape is greater than a semicircle.

23. The flexible printed circuit film according to claim 21, wherein the concave shape has a shape of an incomplete circle.

24. The flexible printed circuit film of claim 20, wherein the second recess has a substantially curved shape.

25. The flexible printed circuit film of claim 13, wherein the first recess is at a region between the inner vertex and the second pad.

26. The flexible printed circuit film of claim 25, further comprising a second recess in a region of the second portion of the body, the region being between the outer vertex of the corner portion and the second pad.

27. The flexible printed circuit film of claim 26, wherein the second recess has a substantially concave shape.

28. The flexible printed circuit film according to claim 27, wherein the concave shape is greater than a semicircle.

29. The flexible printed circuit film according to claim 27, wherein the concave shape has a shape of an incomplete circle.

30. The flexible printed circuit film of claim 26, wherein the second recess has a substantially curved shape.

31. The flexible printed circuit film according to claim 13, wherein the first recess includes a cutout portion.

32. The flexible printed circuit film according to claim 25, wherein the second recess has a substantially curved shape.

33. A printed circuit film for connecting external circuits comprising:
   an L-shaped body having a first portion and a second portion;
   a first pad connected to the first portion;
   a second pad connected to the second portion and electrically connected to the first pad; and
   at least one force absorbing recess portion in the body that absorbs a force transferred from the second pad, the force applied to engage the second pad to an external circuit.

34. The printed circuit film according to claim 33, wherein the at least one force absorbing recess portion includes a cutout portion.

* * * * *